United States Patent [19]

Yamanaka

[11] 4,173,752
[45] Nov. 6, 1979

[54] GRAY CODE READER

[75] Inventor: Masami Yamanaka, Miki, Japan

[73] Assignee: Yamato Scale Company, Limited, Hyogo, Japan

[21] Appl. No.: 889,910

[22] Filed: Mar. 24, 1978

[30] Foreign Application Priority Data

Jun. 7, 1977 [JP] Japan .................................. 52-67667
Jun. 7, 1977 [JP] Japan .................................. 52-67668

[51] Int. Cl.² .................... G06F 11/10; H03K 13/34
[52] U.S. Cl. .................... 340/146.1 AG; 340/347 P; 340/347 M
[58] Field of Search ............... 340/146.1 AG, 347 M, 340/347 P

[56] References Cited

U.S. PATENT DOCUMENTS

| | | | |
|---|---|---|---|
| 3,187,325 | 6/1965 | Waldhauer | 340/347 M |
| 3,594,735 | 7/1971 | Furlong | 340/347 M |
| 3,913,095 | 10/1975 | Dlugos | 340/347 M |
| 3,938,083 | 2/1976 | Stansfield | 340/146.1 AG |
| 3,947,843 | 3/1976 | Presentey | 340/347 M |
| 3,999,064 | 12/1976 | Kramer | 340/347 M |
| 4,025,914 | 6/1977 | Akita | 340/347 M |

*Primary Examiner*—Charles E. Atkinson
*Attorney, Agent, or Firm*—Eugene E. Geoffrey, Jr.

[57] ABSTRACT

An analog to digital convertor for converting mechanical motion to an electric digital signal which includes a code plate carrying gray codes for measuring displacement, codes for parity bits and parity check control bits and gray code reading means and decoder therefore wherein the parity bits detect the occurrence of a read-out error and producing a warning signal while the parity check control bits detect an incorrect parity check caused by errors in the sensing operation such as dirt, dust, or damaged sensing elements, and produces a second warning signal, a memory for temporarily storing the output of the decoder and circuitry inter-connected with the memory and decoder to produce a third warning signal when the difference between the outputs of the memory and the decoder is greater than a predetermined value, circuitry for producing a first error signal when only the second warning signal is present and a second error signal when at least the first and third warning signals are present.

8 Claims, 6 Drawing Figures

GRAY CODE READER

This invention relates to an improvement in a gray code reader used in an analog-to-digital (A-D) converter which is especially useful for converting mechanical displacement into an electric digital signal.

As well know in the art, the gray code system has been developed for minimizing read-out error in an A-D convertor and is also referred to as a unit-distance code, cyclic binary code or reflected binary code. An example of this code system is shown in the following table, in which the gray codes are arranged to correspond to a decimal sequence.

TABLE

| Decimal Codes | Binary Gray Code | | | | | | Parity Bits |
|---|---|---|---|---|---|---|---|
| | Gray Codes | | | | | | |
| | $2^5$ | $2^4$ | $2^3$ | $2^2$ | $2^1$ | $2^0$ | |
| 0 | 0 | 0 | 0 | 0 | 0 | 0 | 1 |
| 1 | 0 | 0 | 0 | 0 | 0 | 1 | 0 |
| 2 | 0 | 0 | 0 | 0 | 1 | 1 | 1 |
| 3 | 0 | 0 | 0 | 0 | 1 | 0 | 0 |
| 4 | 0 | 0 | 0 | 1 | 1 | 0 | 1 |
| 5 | 0 | 0 | 0 | 1 | 1 | 1 | 0 |
| 6 | 0 | 0 | 0 | 1 | 0 | 1 | 1 |
| 7 | 0 | 0 | 0 | 1 | 0 | 0 | 0 |
| 8 | 0 | 0 | 1 | 1 | 0 | 0 | 1 |
| 9 | 0 | 0 | 1 | 1 | 0 | 1 | 0 |
| 10 | 0 | 0 | 1 | 1 | 1 | 1 | 1 |
| 11 | 0 | 0 | 1 | 1 | 1 | 0 | 0 |
| 12 | 0 | 0 | 1 | 0 | 1 | 0 | 1 |
| 13 | 0 | 0 | 1 | 0 | 1 | 1 | 0 |
| 14 | 0 | 0 | 1 | 0 | 0 | 1 | 1 |
| 15 | 0 | 0 | 1 | 0 | 0 | 0 | 0 |
| 16 | 0 | 1 | 1 | 0 | 0 | 0 | 1 |
| 17 | 0 | 1 | 1 | 0 | 0 | 1 | 0 |

In the application of such code system to an A-D convertor, a code plate is provided having, for example, a row-and-column array of transparent and opaque squares arranged in the same fashion as the code array in the table, wherein the transparent and opaque squares correspond respectively to "0" and "1" bits. The code plate is arranged to move in the direction of decimal sequence in proportion to the displacement to be detected and a plurality of photoelectric sensing elements are arranged in a row so as to face to the respective bits for distinguishing them. According to a feature of the gray code system, the number of bits varying between the adjoining codes, which is referred to as "code distance," is minimum, that is, unity. Accordingly, even when the row of sensing elements is on the boundary between the adjoining codes, no code other than these adjoining codes can be read even if there should be a read-out error. Thus, the read-out error is minimized by the gray code system.

Although the gray code system has such superior read-out reliability, it cannot overcome read-out errors caused by dust and lint lying on the code plate or the photoelectric sensing elements getting out of order. In order to detect such read-out errors, it has been proposed to use a technique of parity check. For example, if the code plate is provided with parity bits added as shown in the above table, the number of "1" bits appearing in any code becomes odd, including the parity bit. Therefore, if an even number is detected by parity check, this must mean an occurrence of the above-mentioned read-out error. Although this method appears effective, it still may have the disadvantage that an incorrect parity check may take place and, for example, an error signal may be produced even when a correct read-out is effected, due to uncertainty of the sensing operation in the vicinity of the boundaries of the codes.

In order to remove this disadvantage, this inventor et al proposed to further add parity check control bits to the code plate. This proposal, which is described in detail in the copending patent application Ser. No. 778,355 filed Mar. 17, 1977, is based upon the idea of interrupting the parity check operation when the sensing elements are in a specific range overlying the each boundary. More specifically, according to the proposal, the gray code reader comprises a code plate carrying gray codes, gray code reading means arranged in one-to-one correspondence with the bits of said gray codes for reading said gray codes and a decoder coupled to the outputs of said reading means for decoding the gray codes as read out. The code plate further carries parity bits and parity check control bits arranged side by side with said gray codes and said parity check control bits consist of first bits lying across the respective boundaries of said gray codes and second bits occupying the remaining portions between said first bits. The gray code reader further comprises parity bit reading means and parity check control bit reading means arranged in correspondence with said parity bits and said parity check control bits, a parity check circuit coupled to the outputs of said gray code reading means and parity bit reading means for effecting the parity check operation, and a parity check control circuit coupled to the output of said parity check control bit reading means for interrupting said parity check operation in response to read-out of said first bit. The effective width of the parity check control bit reading means is preferably selected to be equal to or less than the width of the first bit of said parity check control bits.

When the parity check control bit reading means senses the first bit, in the proposed device, the parity check control circuit supplies an output to the parity check circuit to interrupt the parity check operation, thereby avoiding parity check errors which may happen in the vicinity of the boundaries of the codes. Due to such interruption of the parity check operation, the probability of checking the erroneous readings was limited to a low value such as 50 to 60 percent in the proposed device.

Accordingly, an object of this invention is to provide a novel and improved gray code reader which has the probability of checking erroneous readings raised up to almost 100 percent.

According to a feature of this invention, the gray code reader comprises a code plate carrying gray codes, parity bits and parity check control bits arranged quite similarly to those of the abovementioned copending application, gray code reading means arranged in correspondence to the respective bits of the gray codes, a decoder for decoding the outputs of the gray code reading means, parity bit reading means and parity check control bit reading means arranged respectively in correspondence to the parity bits and parity check control bits, and a parity check circuit for receiving the outputs of the gray code reading means and parity bit reading means to execute parity check operation. The parity check control bit reading means produces a first warning signal when it senses the first bit of the parity check control bits and the parity check circuit produces a second warning signal when it senses undesired parity. The gray code reader comprises, in addition, a memory for temporarily storing the output of the decoder, a subtractor for producing a difference between the content of the memory and the output of the decoder, a comparator for comparing the output of the subtractor with a predetermined value to produce a third warning signal when the output of the subtractor is greater, memory control means for interrupting the input of the memory in response to at least one of the first and second warning signals, first error informing means for producing an error signal in response to the second warning signal only when the first warning signal is not existing, and second error informing means for producing an error signal in response to at least both of the first and third warning signals.

Other features and objects of this invention will be described in more detail hereinunder with reference to the accompanying drawings.

IN THE DRAWINGS

Throughout the drawings, like reference numerals are used to denote like structural components.

Figure 1:
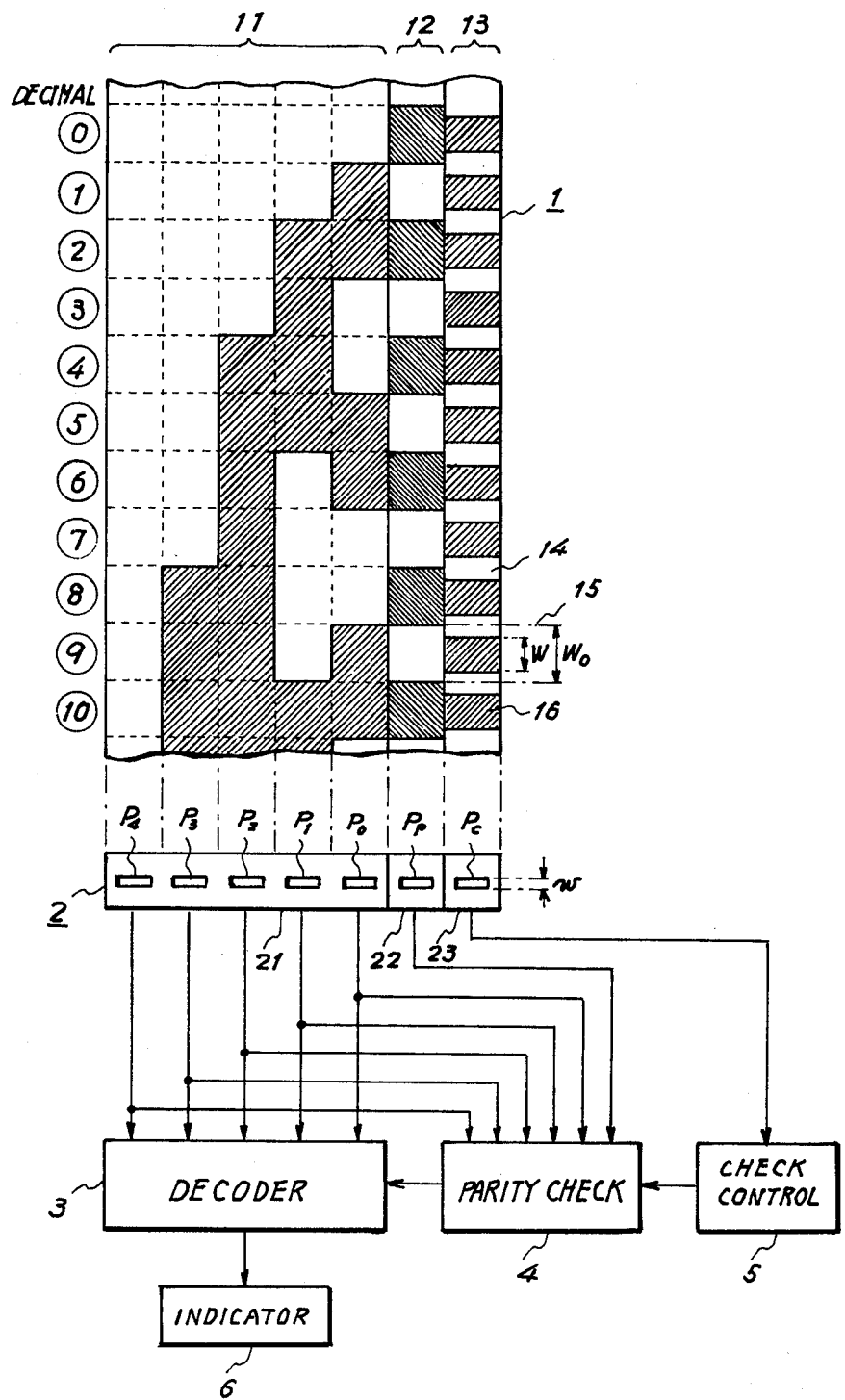
FIG. 1 is a schematic diagram representing a typical example of gray code reader according to the prior art.

Referring to FIG. 1, a code plate 1 consists of a gray code section 11, a parity bit section 12 and a parity check control bit section 13. In each section, the cross hatched regions are opaque and correspond to "1" bits and the blank regions transparent and correspond to "0" bits. The gray codes and parity bits in this drawing are arranged in accordance with those in the table appearing on this specification. As shown in the drawing, all bits are arranged in complete row-and-column or checkerboard array throughout the sections 11 and 12, while the bits are arranged in somewhat different fashion in the section 13. More particularly, in this section 13, narrow "0" bits 14 are disposed across respective boundaries 15 of the gray codes and the remaining portions 16 between these "0" bits are occupied by "1" bits.

Just behind the code plate 1, there is a photoelectric sensing device 2 which consists of a gray code sensing section 21, a parity bit sensing section 22 and a parity check control bit sensing section 23. The section 21 has five photoelectric sensing elements such as photocells having light receiving windows or slits P4, P3, P2, P1 and P0, respectively, and the sections 22 and 23 have similar sensing elements having windows Pp and Pc, respectively. The windows P4, P3, P2, and P0 are disposed to face to the digits $2^4$, $2^3$, $2^2$, $2^1$ and $2^0$ of the gray code 11, respectively, and the windows Pp and Pc are disposed to face to the parity bits 12 and the parity check control bits 13, respectively. In order to minimize read-out error, it is desired that these windows are precisely dimensioned with a width w and aligned on a straight line. It is further desired that the width w is related to the distance Wo between the code boundaries 15 and the width W of the "1" bit 16 of the parity check control bits 13 by the following equation.

$$w \leq Wo - W$$

A light source, which is not shown in the drawing, is provided in front of the code plate 1 and arranged to uniformly illuminate all windows of the sensing elements through the code plate 1. Each sensing element produces an output when it senses a light from the light source.

The outputs of the sensing elements of the section 21 are applied to a decoder circuit 3 and also to a parity check circuit 4 which receives also the output of the sensing element of section 22. The output of the sensing element of the section 23 is applied to a parity check control circuit 5. The output of the parity check control circuit 5 is coupled to the parity check circuit 4 and the output of the parity check circuit 4 is coupled to the decoder circuit 3. The output of the decoder circuit 3 is supplied to a utilization device such as an indicator 6.

When the device of this invention as described above is applied to a utilization device, the code plate 1 is interlocked with a member of the utilization device, which exhibits a displacement to be detected, for example, a cradle of a spring balance, so that it moves with that member in proportion to that displacement in the vertical direction of the drawing.

When the window or slit Pc of the parity check control bit sensing section 23 faces to the "1" bit 16 of the section 13 during the movement of the code plate 1, no output is supplied from the section 23 to the parity check control circuit 5 and the latter is not actuated. Therefore, the decoder circuit 3 and the parity check circuit 4 execute their normal operations based upon the outputs of the gray code sensing section 21 and the parity bit sensing section 22. More particularly, the decoder circuit 3 decodes the gray code sensed by the section 21 and the indicator 6 displays a decimal code indicating the corresponding displacement, while the parity check circuit 4 checks parity of the number of "1" bits from the outputs of the sections 21 and 22 and applies an inhibit signal to the decoder 3 to interrupt its operation when the parity is improper (even in this case). Accordingly, the decoder circuit 3 is rendered inactive and the indicator 6 gives no indication, even if any "0" bit is sensed erroneously as "1" due to dust or lint lying on the "0" bit region or by a damaged or inactive sensing element.

When the window or slit Pc of the section 23 faces to "0" bit 14 of the parity check control bit section 13, the sensing section 23 supplies an output to the parity check control circuit 5. In response to this output, the parity check control circuit 5 produces a control signal and supplies it to the parity check circuit 4 to interrupt its operation. During this time, therefore, no parity check is executed and the indicated value may include a read-out error caused by dust or lint on the code plate 1 or a damaged or inactive sensing element.

As described above, the prior art device has a probability of read-out error which happens and this probability is really as high as 40 to 50% though it is a function of the values W and Wo above mentioned. French patent specification No. 72. 07861 proposed to interrupt the decoding operation with the sensing output of the section 23. Although the probability of causing read-out error may be minimized by the such method, it is understood that the possibility or chance of reading is remarkably reduced.

Figure 2:
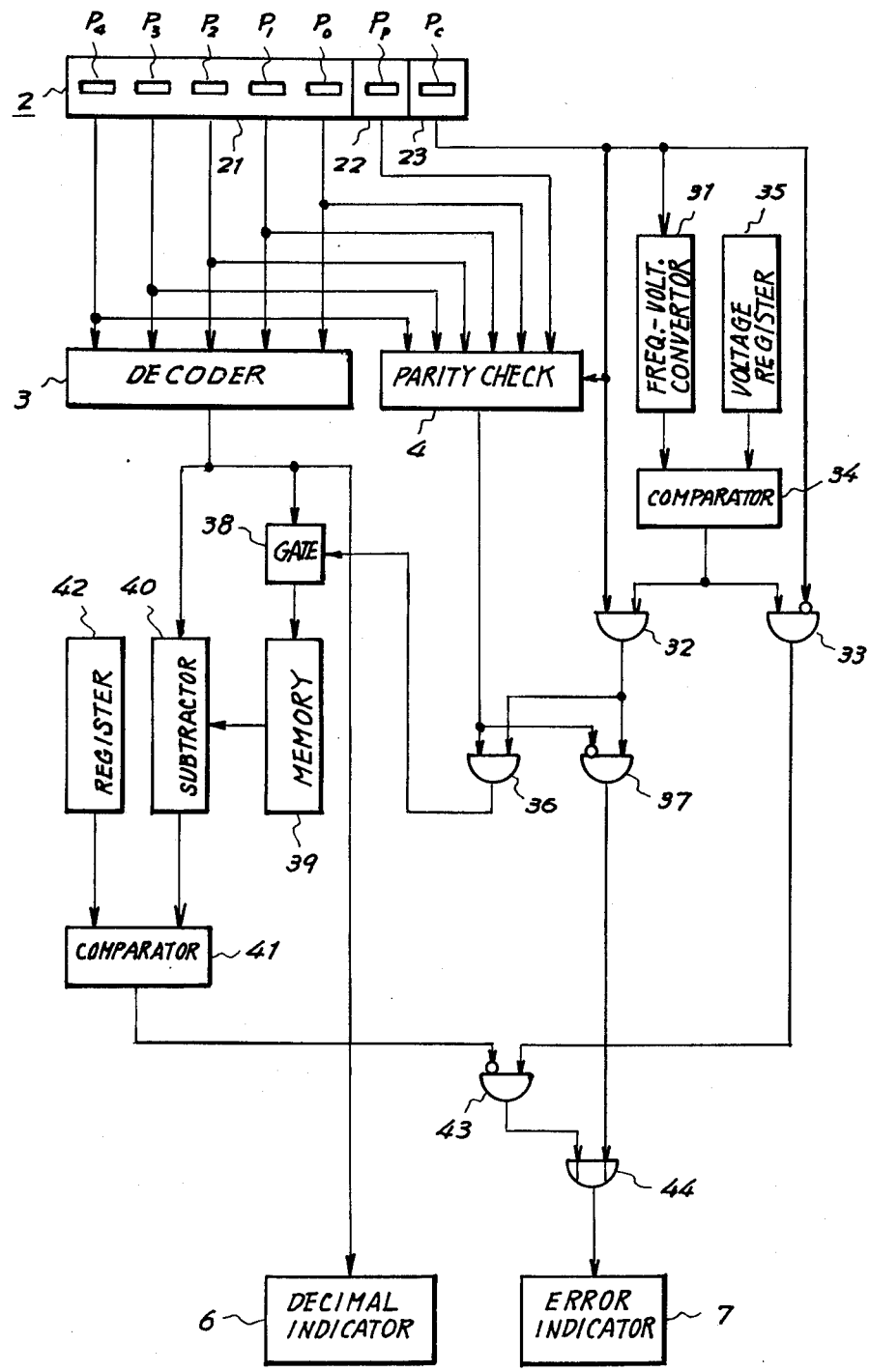
FIG. 2 is a block circuit diagram representing an embodiment of gray code reader according to this invention.

Referring next to FIG. 2 representing a first embodiment of this invention, this circuit also includes a photoelectric sensing device 2 consisting of three sensing sections 21, 22 and 23 the outputs of which are connected to decoder 3 and parity check circuit 4 as in the cirucit of FIG. 1. In this circuit, however, the output of the parity check control bit sensing section 23 is also applied to a frequency-voltage convertor 31, one input of an AND circuit 32 and a NOT-input of an AND circuit 33. The frequency-voltage convertor 31 is of a known type and serves a function of converting a frequency into a voltage level. The output of the frequency-voltage convertor 31 is supplied to a comparator circuit 34 to be compared with a voltage level stored in a voltage register 35. The comparator 34 is arranged to produce "1" output when the output of the convertor 31 is equal to or less than the output of the register 35 and "0" output when the former is greater than the latter. The output of the comparator 34 is applied to separate inputs of the AND circuits 32 and 33, respectively.

The output of the parity check circuit 4 is connected to one input of an AND circuit 36 and a NOT-input of another AND circuit 37 and another input of each of these AND circuits is supplied from the output of the AND circuit 32. The output of the AND circuit 36 is applied to a control input of a gate circuit 38.

The output of the decoder circuit 3 is connected through the gate circuit 38 to a memory 39 and directly to a subtractor circuit 40 which is also supplied with the output of the memory 39. The subtractor 40 is arranged to produce an absolute value of difference between both outputs of the memory 39 and decoder 3, and its output is supplied to a comparator circuit 41 to be compared with the output of a register 42. The comparator is arranged to produce "1" output when the output of the subtractor 40 is equal to or less than the output of the register 42 and "0" output when the former is greater than the latter. The output of the decoder 3 is also coupled to a decimal indicator 6 and visually displayed thereby.

The output of the comparator 41 is supplied to a NOT-input of an AND circuit 43 the normal input of which is connected to the output of the AND circuit 33. The output of the AND circuit 43 is supplied with the output of the AND circuit 37 to an OR circuit 44 the output of which is applied to an error indicator 7. The error indicator 7 is arranged to give an "error" indication when the output of the OR circuit 44 is "1."

The circuit of FIG. 2 is especially suitable and useful when it is applied with the code plate 1 of FIG. 1 to a weighing balance, in which the code plate 1 exhibits vibration or swinging motion at the beginning of measurement. Although the amplitude of vibration is substantially large at first, it decreases gradually and becomes zero at last. This means that the frequency of the sensing output of the sensing section 23 decreases gradually towards zero and, accordingly, the output voltage of the convertor 31 drops gradually down to zero in proportion to the speed of motion of the code plate 1. A predetermined voltage level, which corresponds to this speed of motion below which the reading operation of the code plate may be allowable, is previously stored in the register 35. Accordingly, the "1" output of the comparator 34 indicates that the allowable measurement condition has been attained.

When the output of the comparator 34 is "0," all logic circuits 32, 33, 36, 37, 43 and 44 are inactive and only the measured value decoded by the decoder 3 is displayed by the indicator 6. Therefore, the following description will be made only in conjunction with the case where the allowable condition has been attained and the output of the comparator 34 is "1."

In the embodiment of FIG. 2, the parity check circuit 4 is arranged to execute normal parity check operation when "1" output of the sensing section 23 is applied to its control input, but interrupt its operation when "0" or no input exists.

During the normal operation, the parity check circuit 4 produces "1" output for the proper parity and "0" output for improper one.

When the parity check control bit sensing window Pc faces to the "1" bit 16 (FIG. 1), the AND circuit 32 supplies "1" output to the both AND circuits 36 and 37 and the parity check circuit 4 executes normal operation.

If the checked parity is proper, the condition is most normal and the decoded value is most reliable. In this case, "1" output is supplied from the parity check circuit 4 to both AND circuits 36 and 37, though it is inverted at the input of the latter one, so that "1" signal is applied to the control terminal of the gate circuit 38 from the AND circuit 36 and "0" signal is supplied to the OR circuit 44 from the AND circuit 37. The gate circuit 38 is opened by the signal "1" to pass the decoded output of the decoder 3 to the memory 39 to store it temporarily therein. It is understood that "0" signal is applied to the gate circuit 38 from the AND circuit 36 and the contents of the memory 39 is not renewed when improper parity is determined by the parity check circuit 4.

The contents of the memory 39 is applied to the subtractor circuit 40 and subtracted from the next decoded value which corresponds to the adjoining gray code on the code plate 1.

In this embodiment, as the difference between the decoded values of the adjoining codes is decimal one (1), the output of the subtractor 40 must be decimal one (1) if there is no read-out error. Accordingly, if decimal one (1) is previously stored in the register 42, the comparator 41 supplies "1" output to the NOT-input of the AND circuit 43 and the AND circuit 41 supplies "0" output to the OR circuit 44. As another input of the OR circuit 44 is also "0" as above-described, "0" output is supplied to the error indicator 7, so that no error indication is executed. On the contrary, if there is any read-out error in the decoded value, the subtractor output is not decimal one (1) and the comparator 41 produces "0" output. As the other input of the AND circuit 43 is "0" as above-described, no output is applied to the OR circuit 44. Therefore, no "error" indication is executed unless the other input of the OR circuit 44 is "1," even if there is some read-out error. However, such read-out error can be detected as improper parity by the parity check circuit 4 and the AND circuit 37 is actuated to supply "1" signal through the OR circuit 44 to the error indiator 7, thereby indicating the read-out error.

When the sensing window Pc faces to the "0" bit 14 (FIG. 1), the operation of the parity check check circuit 4 is interrupted and the AND circuits 32, 36 and 37 are made inactive, while the AND circuit 33 is actuated to supply "1" output to the AND circuit 43. Accordingly, if read-out error is detected by the comparator 41, the AND circuit 43 supplies "1" output through the OR circuit 44 to the error indicator 7 to indicate "error."

As described above, correct and reliable read-out operation can be attained throughout the code plate, even in the vicinity of the code boundary 15, by the above embodiment of this invention.

While, in the above embodiment, decimal one (1) is stored in the register 42, it is presumable that the read-out error checking sensitivity would be raised by decreasing this decimal value stored in the register 42. However, such method can not be realized since the minimum change of the decoded decimal number is one (1) or zero in the above embodiment. The embodiments described hereinunder have been provided for realizing the above presumption to raise the error checking ability with a novel and clever contrivance.

Figure 3:
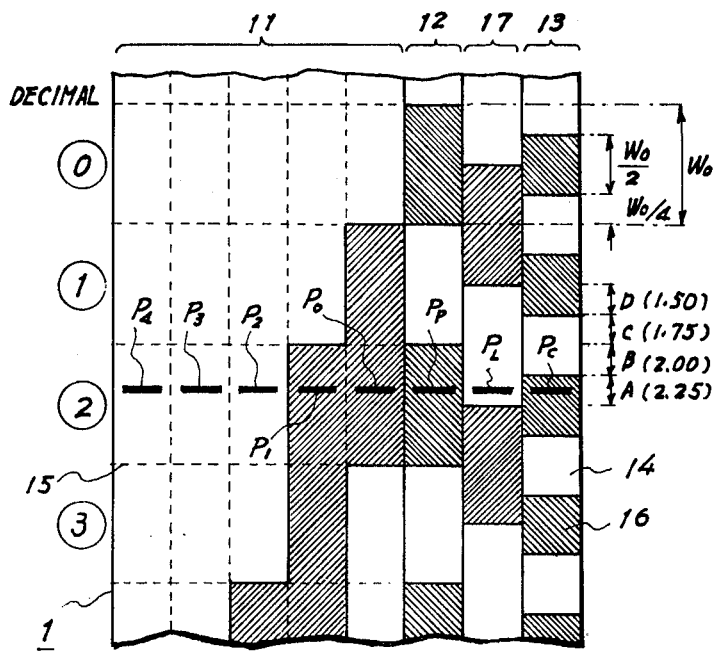
FIG. 3 is a schematic diagram representing an embodiment of code plate according to this invention.

Referring to FIG. 3 representing a code plate 1 which is a modification of the code plate 1 as shown in FIG. 1, an advanced phase code section 17 is disposed between the parity bit section 12 and parity check control bit section 13. The bit arrangement of the advanced phase code 17 is quite similar to that of the parity bits 12 though the former is advanced by a half of the bit width Wo with respect to the latter. In this code plate, moreover, the widths of the "1" and "0" bits 16 and 14 are both selected to be equal to a half of the bit width Wo, that is, $W = W_o/2$. As in the case of FIG. 1 bit sensing windows P4, P3, P2, P1, P0, Pp and Pc are arranged on a straight line together with a sensing window PL for the advanced phase code 17. It can be seen that the three codes 12, 13 and 17 constitute in combination another gray code system defining the fraction below the decimal point at every quarter of unity, that is, at intervals of 0.25.

Figure 4:
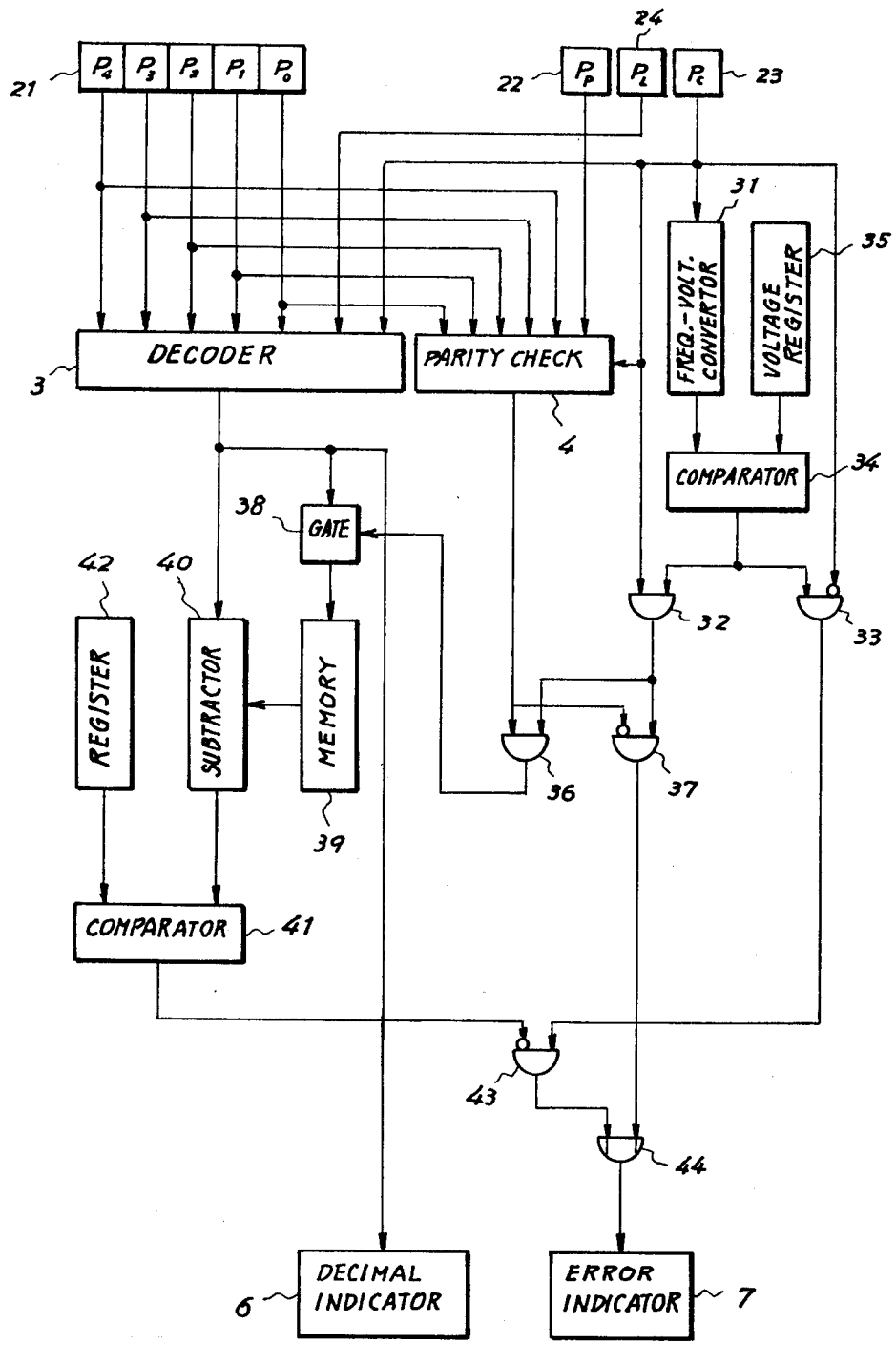
FIG. 4 is a block circuit diagram representing another embodiment of gray code reader according to this invention.

The circuit shown in FIG. 4 is useful for reading and processing the various codes 11, 12, 13 and 17 on the code plate 1 shown in FIG. 3. This circuit is almost the same as the circuit of FIG. 2 except that the outputs of the sensing section 23 and an additional sensing section 24 having the window PL are further supplied to the decoder circuit 3. As a feature of this embodiment, the decoder 3 is arranged to decode the gray code formed of the three codes 12, 13 and 17 for defining the fraction below the decimal point, in addition to the gray code 11. The decimal indicator 6 may be arranged to indicate or omit this fraction. However, the fraction is supplied through the gate circuit 38 to the memory 39 and stored therein together with the integral part of the decoded value.

As readily understood, the gate circuit 38 is controlled in the same manner as in the circuit of FIG. 2 and is closed when the sensing window Pc faces to the "0" bit 14 of the control bit section 13 (FIG. 3). Accordingly, the memory 39 can not be renewed at this time.

By way of example, it is now assumed that the sensing windows have come in the position A as shown in FIG. 3 and a decimal value 2.25 is stored in the memory 39. When the code plate 1 sways and the window Pc moves upwardly A-B-C-D, the subtractor 40 produces outputs 0.25, 0.50 and 0.75 sequentially at the positions B, C and D, respectively, and the memory 39 is renewed at the position D. As the memory 39 can not be renewed at the position B, the difference between 2.00 and 1.75 (=0.25) cannot be detected. Therefore, the minimum detectable difference is 0.50. Accordingly, if the value 0.50 is previously stored in the register 42 and the comparator 41 is arranged to produce "1" output when the output of the subtractor is equal to or less than 0.50 and "0" output when the former is greater than the latter, the error checking sensitivity is doubled as compared with the circuit of FIG. 2.

Figure 5:
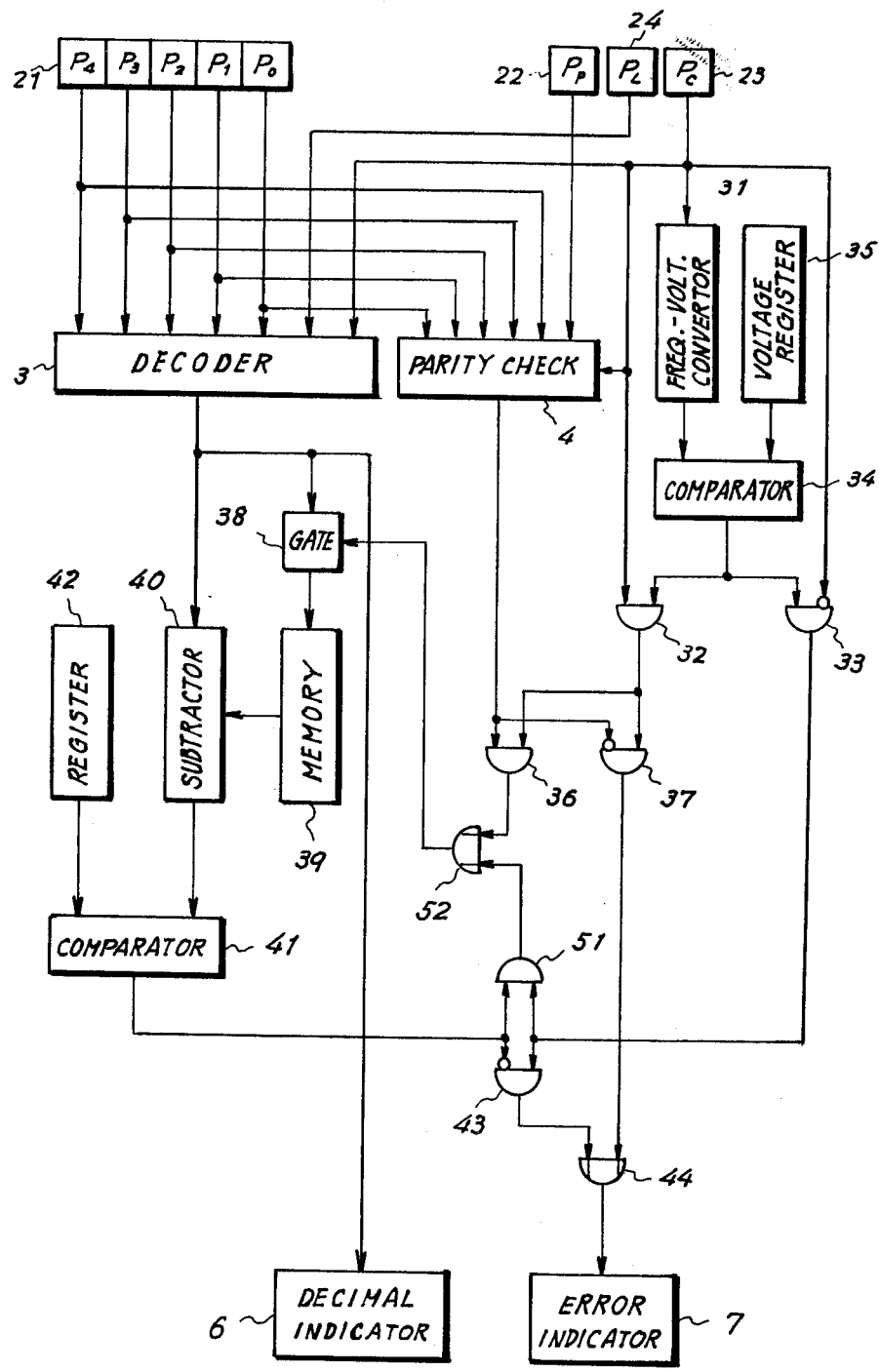
FIG. 5 is a block circuit diagram representing a further embodiment of gray code reader according to this invention.

A further improved embodiment of this invention is shown in FIG. 5. This circuit is fully the same as that of FIG. 4 except a part of the logic configuration and the same code plate 1 as shown in FIG. 3 is used also in this embodiment. The only difference is that the inputs to the AND circuit 43 are also applied to an AND circuit 51 and the output of the AND circuit 51 is supplied together with the output of the AND circuit 36 to the control terminal of the gate circuit 38 through an OR circuit 52.

As readily understood, in this circuit, even at the position B (FIG. 3), "1" output of the AND circuit 51 is supplied through the OR circuit 52 to the gate circuit 38 to renew the memory 39 if no error is detected and the comparator 41 produces "1" output. Accordingly, the minimum detectable difference is 0.25 and, if 0.25 is previously stored in the register 42 and the comparator 41 is arranged to produce "1" output when the output of the subtractor is equal to or less than 0.25 and "0" output when the former is greater than the latter. Thus, the error checking sensitivity is again doubled as compared with the circuit of FIG. 4.

Figure 6:
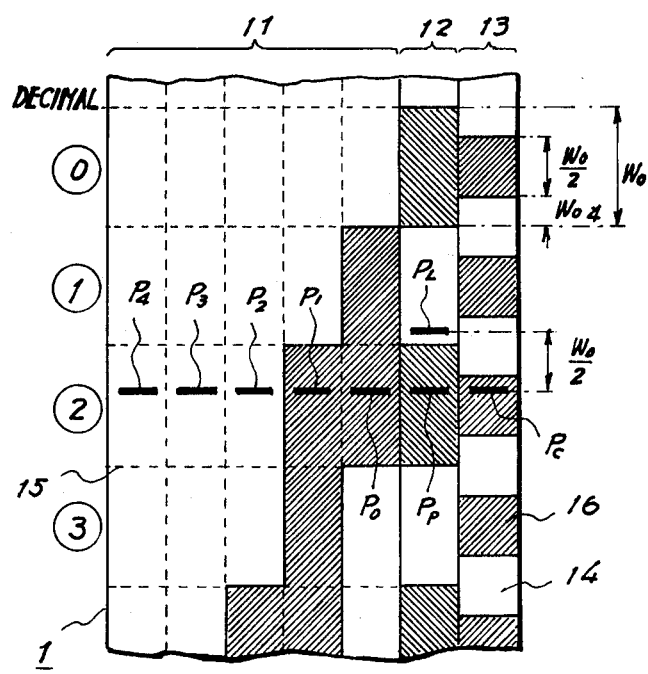
FIG. 6 is a schematic diagram representing another embodiment of code plate according to this invention.

FIG. 6 shows a modification of the code plate 1 of FIG. 3. In this modified code plate 1, the advanced phase code section 17 is omitted though the other sections 11, 12 and 13 are completely the same as those of FIG. 3. However, in the device provided with this code plate, as shown in FIG. 6, the sensing windows other than the advance phase code sensing window PL are arranged on a straight line and the window PL is disposed laterally apart from the parity bit sensing window Pp by a distance equal to $W_o/2$. The window PL may be apart either upwardly or downwardly from the window Pp. It is easy to understand that this configuration enables use of the code section 12 as both parity check code and advance phase code and can provide the same function as the abovementioned configuration using the code plate 1 shown in FIG. 3.

It should be noted that the above description has been made only by way of example and various modifications and changes may be realized in accordance with the principle of this invention without departing from the scope of the invention as defined in the appended patent claims. For example, the code plate and its sensing system may be of another type than the photoelectric type, such as magnetic type, and the logic configuration may be substituted by any suitable one other than those shown in the drawings.

I claim:

1. A gray code reader, comprising a code plate having gray code bits, parity bits and parity check control bits arranged side by side, said parity check control bits consisting of first bits representing one binary level and lying respectively across the boundaries of the adjoining gray code bits and second bits representing the other binary level and occupying the remaining portions between said first bits, gray code bit reading means arranged in correspondence with the respective bits of said gray code bits for reading said gray code bits, a decoder for decoding the output of said gray code bit reading means, parity bit reading means and parity check control bit reading means arranged respectively in correspondence with said parity bits and parity check control bits for reading said bits respectively, a parity check circuit for receiving the output of said gray code bit reading means and parity bit reading means and executing parity check operation said parity check control bit reading means producing a first warning signal upon sensing of said first bits and said parity check circuit producing a second warning signal when the parity is incorrect, a memory for temporarily storing the output of said decoder, a subtractor for producing a difference between the content of said memory and the output of said decoder, a first comparator for comparing said difference with a predetermined value and producing a third warning signal when the difference is greater than the other, memory control means for interrupting the input of said memory in response to at least one of said first and second warning signals, first error indicating means for producing an error signal in response to said second warning signal only in the absence of said first warning signal, and second error indicating means for producing an error signal in response to at least both of said first and third warning signal.

2. A gray code reader, according to claim 1, wherein said predetermined value is selected to be equal to the interval of the decimal numbers represented by said gray code bits.

3. A gray code reader, according to claim 1, comprising further a frequency-to-voltage convertor for receiving the output of said parity check control bit reading means and converting the alternating frequency of said output into voltage, a second comparator for comparing the output voltage of said convertor with a predetermined voltage and producing a fourth warning signal when said predetermined voltage is lower, means for interrupting said first warning signal supplied to said first error indicating means in response to said fourth warning signal, and means for interrupting said error signal of said second error indicating means in response to said fourth warning signal.

4. A gray code reader, according to claim 1, wherein said code plate further includes advanced phase bits which have a code array the same as said parity bits and are shifted by a half of the width of said parity bits with respect to the latter, said first and second bits of said parity check control bits are the same in width and arranged symmetrically about said boundaries, advanced phase bit reading means arranged facing said advanced phase bits and on the same line as said gray code bit reading means for reading said advanced phase bits, and said gray code bit reading means being arranged to receive the output of said advanced phase bit reading means and the output of said parity check control bit reading means in addition to the output of said gray code bit reading means to decode said outputs at at least 25% of the least significant digit of the decoded value of said gray code bits.

5. A gray code reader, according to claim 4, including means for interrupting the input of said memory in response to said third warning signal.

6. A gray code reader, according to claim 1, wherein said first and second bits of said parity check control bits are the same in width and arranged symmetrically about said boundaries, and advanced phase bit reading means disposed facing said parity bits and being shifted by a half of the width of said parity bits with respect to said parity bit reading means, for reading said parity bits, and said decoder being arranged to receive the outputs of said advanced phase bit reading means and parity check control bit reading means in addition to the output of said gray code reading means to decode said outputs to a quarter of the least significant digit of the decoded value of said gray code.

7. A gray code reader, according to claim 6, including means for interrupting the input of said memory in response to said third warning signal.

8. A gray code reader, according to claim 6, including a frequency-to-voltage convertor for receiving the output of said parity check control bit reading means and converting the alternating frequency of said output into voltage, a second comparator for comparing the output voltage of said convertor with a predetermined voltage and producing a fourth warning signal when said predetermined voltage is lower, means for interrupting said first warning signal supplied to said first error indicating means in response to said fourth signal, and means for interrupting said signal of said second error indicating means in response to said fourth warning signal.

* * * * *